(12) United States Patent
Tezuka et al.

(10) Patent No.: US 11,815,810 B2
(45) Date of Patent: Nov. 14, 2023

(54) MEASUREMENT TOOL AND METHODS FOR EUV LITHOGRAPHY MASKS

(71) Applicant: Intel Corporation, Santa Clara, CA (US)

(72) Inventors: Yoshihiro Tezuka, Tsukuba (JP); Marieke Ordway, San Jose, CA (US); Charles Holzwarth, Austin, TX (US)

(73) Assignee: INTEL CORPORATION, Santa Clara, CA (US)

( * ) Notice: Subject to any disclaimer, the term of this patent is extended or adjusted under 35 U.S.C. 154(b) by 221 days.

(21) Appl. No.: 17/481,365

(22) Filed: Sep. 22, 2021

(65) Prior Publication Data
US 2022/0004106 A1   Jan. 6, 2022

(51) Int. Cl.
*G03F 1/84* (2012.01)
*G03F 7/00* (2006.01)
*G03F 7/20* (2006.01)

(52) U.S. Cl.
CPC ............ *G03F 1/84* (2013.01); *G03F 7/70783* (2013.01)

(58) Field of Classification Search
CPC .............................. G03F 1/84; G03F 7/70783
USPC ............................................................ 430/5
See application file for complete search history.

(56) References Cited

U.S. PATENT DOCUMENTS

| 11,300,889 | B2 * | 4/2022 | Van Dijk | ............ | G03F 7/70433 |
| 11,500,298 | B2 * | 11/2022 | Monkman | ............... | G03F 7/707 |
| 2003/0202174 | A1 | 10/2003 | Smith et al. | | |
| 2011/0116077 | A1 | 5/2011 | Chuang et al. | | |
| 2016/0274029 | A1 | 9/2016 | Bol et al. | | |
| 2017/0256045 | A1 | 9/2017 | Miyai et al. | | |
| 2022/0004106 | A1 | 1/2022 | Tezuka et al. | | |

FOREIGN PATENT DOCUMENTS

CN           111103757 A         5/2020

OTHER PUBLICATIONS

Hellweg, Dirk et al., "Actinic review of EUV masks: performance data and status of the AIMS EUV system", Proc. SPIE 10143, Extreme Ultraviolet (EUV) Lithography VIII, dated Mar. 24, 2017, 13 pages.
Miyai, Hiroki et al., "Actinic patterned mask defect inspection for EUV lithography", Proc. SPIE 11148, Photomask Technology 2019, dated Nov. 25, 2019, 10 pages.
International Search Report for corresponding PCT application No. PCT/US2022/040532, dated Nov. 28, 2022, 4 pages (for informational purposes only).

* cited by examiner

*Primary Examiner* — Christopher G Young
(74) *Attorney, Agent, or Firm* — VIERING,JENTSCHURA&PARTNER MBB

(57) ABSTRACT

The present disclosure is directed to EUV mask inspection tools including a source assembly that generates a EUV beam, a detector assembly having a projection optics system, a processor, a movable stage supporting a patterned mask, a stage control system, and a processor programmed to set the height for the stage based on instructions of a first program module that analyzes and combines mask pattern data and mask layout information to generate an out-of-plane distortion map. In an aspect, a second program module generates instructions to analyze inspection results outputted by the inspection tool to generate a defocus characterization map. In a further aspect, a present method provides predictive data and actual measured data to determine stage heights for use by a present mask inspection tool for inspection of patterned EUV masks to obtain results that compensate for defocusing to due to bowing of the patterned EUV mask.

20 Claims, 9 Drawing Sheets

MEASUREMENT TOOL AND METHODS FOR EUV LITHOGRAPHY MASKS

BACKGROUND

As scaling continues further into the submicron regime and extreme ultraviolet (EUV) lithography technology enters high volume manufacturing, the use of EUV lithography masks is at the forefront of semiconductor processing. EUV typically denotes soft x-rays with wavelengths between 124 and 10 nm or photon energies between 10 eV and 124 eV. There is, however, a need for actinic patterned mask inspection, since the patterns on wafers are reproductions of those on photomasks. The quality of the wafer patterns, as measured by linewidth control, overlay, and defects, is strongly affected by the quality of the corresponding parameters on the masks. Linewidth variations on the reticles ultimately result in linewidth variations on the wafer. Mask registration errors contribute to overlay errors. Defects on the reticle may result in a nonworking die. Consequently, masks are critical components of EUV lithographic technology.

A robust EUV mask infrastructure will play an important role in the successful introduction of EUV into high-volume manufacturing by providing mask shops with actinic tools with inspection capabilities. Actinic inspection of masks in computer chip manufacture refers to inspecting the mask with the same wavelength of light used by a lithography system for a patterning step during the manufacturing process. One of the merits of using actinic inspection is its high image resolution. Because of the much shorter wavelength, an actinic inspection provides high resolution and high contrast images.

There are actinic metrology platforms based on aerial imaging technology and other technologies that have been developed that may fulfill the mask shop requirements for actinic defect review and repair verification. For example, a critical dimension scanning electron microscope (CD-SEM) is a dedicated tool that may be used for measuring the dimensions of fine patterns. In semiconductor manufacturing, CD-SEM may be used as a wafer inspection tool for inspecting the various features of the semiconductor devices, as well as being used for inspecting EUV lithography masks. In addition, aerial imaging inspection tools, e.g., AIMS™, may have the capability of providing a full emulation of the scanner imaging process (e.g. automated mask handling, etc.) and use aerial imaging through focus stack acquisition for the full review of a structure and any defect printing behavior. However, the measurements by AIMS-like tools may be slow, even though the resulting data may correlate well with the CD of the wafer.

The inspection of EUV masks requires techniques for high-resolution imaging to determine the exact defect location on the patterned mask. Presently, a combination of CD-SEM data and AIMS data have been used to qualify mask CD uniformity, which may be cumbersome. In actinic patterned mask inspection for EUV mask, inspection images may be blurred depending on the locations within the mask, which may result in false defects being generated. Moreover, a single focus offset value cannot optimize all locations together. Also, empirical focus values cannot be estimated for a first inspection of a new product mask. Accordingly, with the need for EUV masks to be defect-free, or at least have minimal defects, there is a need for improved EUV mask inspection tools and methods for mask inspections.

BRIEF DESCRIPTION OF THE DRAWINGS

In the drawings, like reference characters generally refer to the same parts throughout the different views. The drawings are not necessarily to scale emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
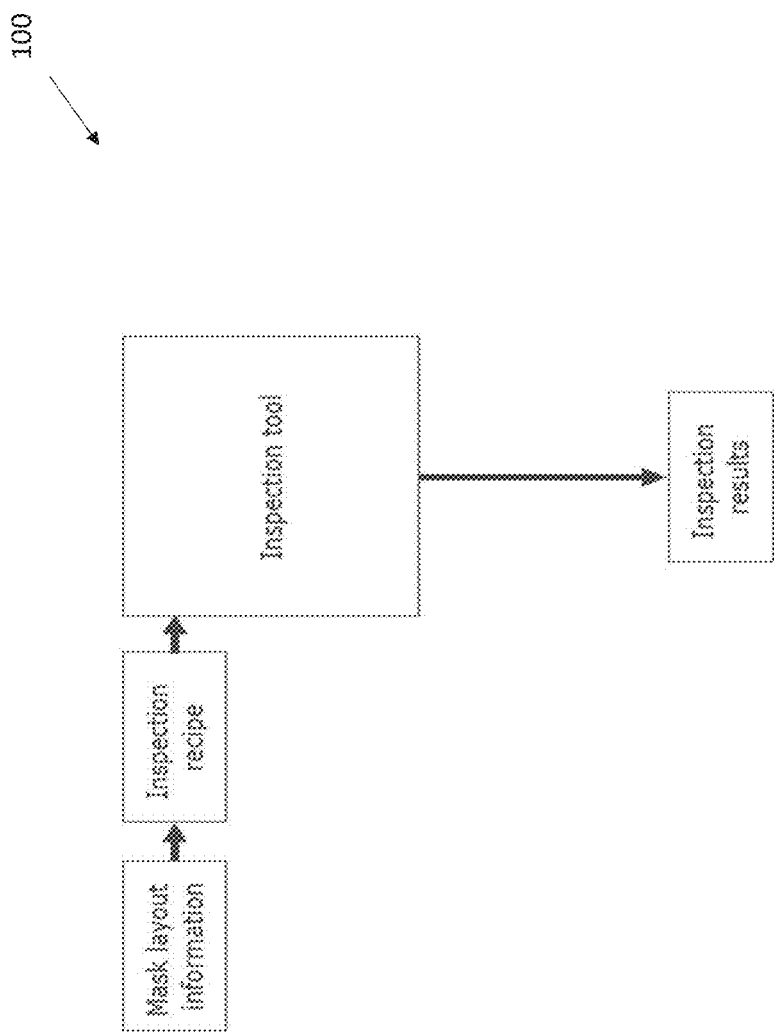
FIG. 1 shows a block diagram of an exemplary EUV inspection tool.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to EUV mask inspection tools including a source assembly that generates a EUV beam, a detector assembly having a projection optics system, a movable stage supporting a patterned mask, a stage control system, and a processor programmed to set the height for the stage based on instructions of a first program module that analyzes and combines mask pattern data and mask layout information to generate an out-of-plane distortion map. In addition, a second program module generates instructions to analyze inspection results outputted by the inspection tool (i.e., blurring value measurement) to generate a defocus characterization map.

In an aspect, the present disclosure generally relates to a method for mask inspection that includes providing a EUV mask inspection tool, providing a patterned mask for inspection positioned on a movable stage of the EUV mask inspection tool, providing an inspection recipe, providing mask layout information and mask pattern data to generate an out-of-plane distortion map based on stress-induced distortion modeling; moving the stage based on the out-of-plane distortion map, and generating mask inspection results for the patterned mask.

In a further aspect, the present disclosure generally relates to an inspection method that provides predictive data and actual measured data to determine stage heights for use by the present mask inspection tool for inspection of patterned EUV masks to obtain results that compensate for defocusing due to bowing and other distortions of the patterned EUV mask.

In particular, the present disclosure provides for data maps to adjust the height of a mask stage of an inspection tool. The present maps can be either prepared by the feedback from actual measurement of the same type of mask, or out-of-plane distortion calculation from pattern information of the mask using stress-induced distortion model, or a combination of the above two.

The present maps may provide Z values for each grid point in an x-y space, i.e., within 152×152 mm area, in a text format to feed to the inspection tool. The present disclosure may be applied to die-to-die inspections and die-to-database inspections of patterned EUV masks.

It is typical for inspections to measure the CDs of selected features of a EUV mask using an inspection "recipe" that provides, among other things, the predetermined test sites on the EUV mask (i.e., image fields for measurement). The number of such test sites can vary greatly, with a common number being approximately 100 to 1000.

FIG. 1 shows a block diagram of an exemplary EUV inspection tool; for example, in conventional die-to-die mask inspection tool 100. As shown in FIG. 1, there may be provided mask layout information to generate an inspection recipe for defining the areas of inspection on a patterned EUV mask. The inspection recipe may be inputted to the inspection tool 100, a pattern EUV mask may be inspected for defects and results may be generated. However, this conventional approach created lots of false defects because of different image qualities at different locations within a patterned EUV mask.

Figure 2:
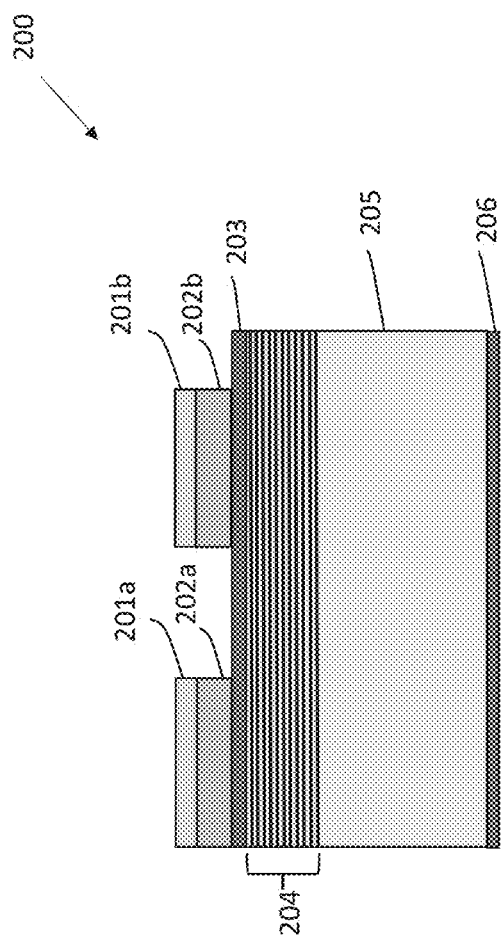
FIG. 2 shows a cross-section view of an exemplary patterned EUV mask according to an aspect of the present disclosure.

In FIG. 2, according to an aspect of the present disclosure, an exemplary EUV mask 200 may consist of a mirror 204 (e.g., 40 to 50 pairs of alternating layers of silicon and molybdenum) on top of a glass substrate or other low thermal expansion material 205, and a ruthenium-based capping layer 203 and conductive backside coating 206 (e.g., a chrome-based opaque layer) on the glass substrate 205. In addition, there may be patterned lines formed, which are shown as anti-reflective coating (ARC) layer 201$a$ on an absorber layer 202$a$ and ARC layer 201$b$ on an absorber layer 202$b$; the ARC may be, for example, $HF_xO_y$ or $Si_xO_yN_z$, and absorber layer may be, for example, TaBO, TaBBN or TaN. For EUV photomask qualification, an actinic review and inspection tool is required due to the nature of EUV light and its reflection process onto the EUV optics, as the structure of the reflective multilayer mirror and absorber layer can strongly affect printability.

Figure 3:
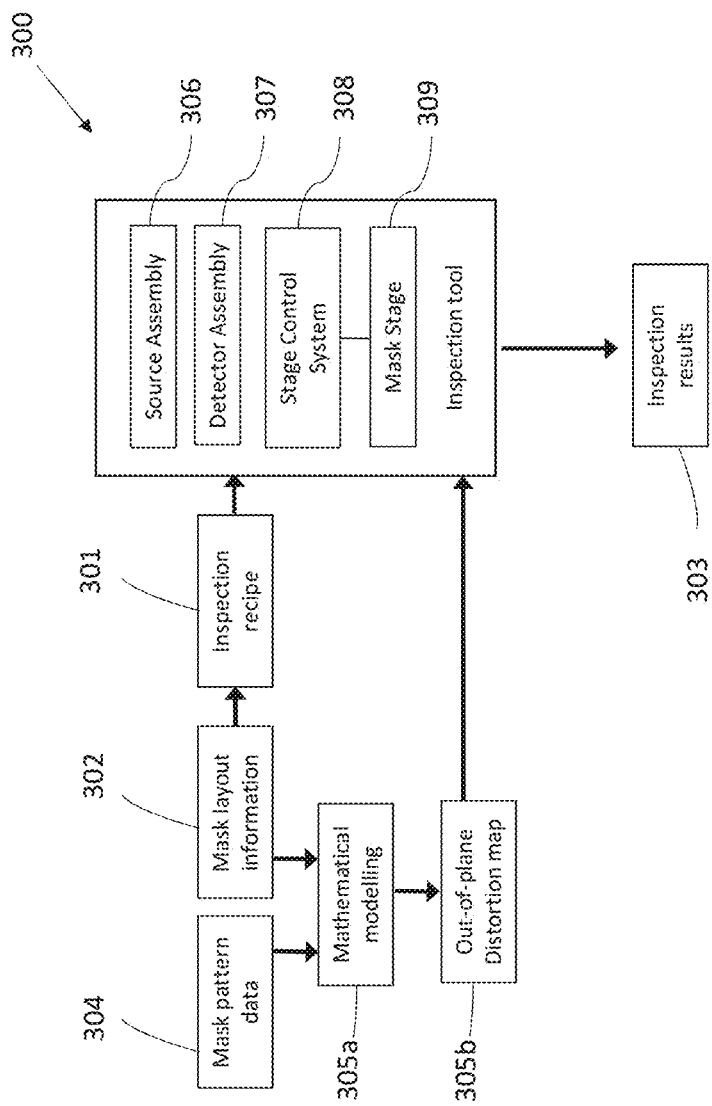
FIG. 3 shows a block diagram of an exemplary EUV inspection tool using out-of-plane map information according to an aspect of the present disclosure.

In FIG. 3, an exemplary EUV inspection tool 300, according to an aspect of the present disclosure, may use out-of-plane map information 305$b$ to generate better inspection images. In this aspect, a combination of mask pattern data/information 304 and mask layout information 302 may be used as inputs to a mathematical model 305$a$ to create out-of-plane distortion map 305$b$ (i.e., Z values for (x,y) grid points) of a patterned EUV mask (not shown). The mathematical model 305$a$ calculates the out-of-plane distortion of the pattern EUV mask by modelling the stress relaxed layer or layers of the EUV mask due to etching in the mask generation process. The calculated out-of-plane distortion map 305$b$ may be inputted, along with an inspection recipe 301, to the inspection tool 300 to modify the stage heights used during the inspection with Z values as a function of x-y coordinates from the calculated (or "predicted") out-of-plane distortion map. In this way, the inspection tool 300 can inspect the whole area of the patent EUV mask using the best focus condition for the specific x-y coordinates. Specifically, an inspection tool will load the out-of-plane distortion map and determine any additional Z-direction movement that the mask stage may need for any (x,y) points during a scan by interpolation from grid data provided in the out-of-plane distortion map.

The present out-of-plane distortion maps and other maps may be generated by numerical simulations of a patterned EUV mask with the finite element method (FEM). In particular, the present maps may be generated by a finite element model that may include the mechanical properties of the EUV mask and inspection tool chucking mechanics. By way of the present maps (i.e., the out-of-plane distortion and defocus characterization maps), a present mask inspection tool may use predictive data or data from an inspection of a patterned EUV masks to obtain improved inspection results that compensate for defocusing due to bowing and other distortions in a patterned EUV mask.

According to the present disclosure, as shown in FIG. 3, the present measurement tool 300 may have subsystems including a source assembly 306 that generates a EUV light beam, a detector assembly 307, which has a optics system and camera (not shown), a movable stage 309 supporting a patterned mask (not shown), a stage control system 308 configured to move the mask stage 309 to various height settings. The source assembly 306 may include (not shown) a EUV light beam generated from a laser produced plasma (LPP) source, which collected from a collector mirror, and reflected/focused through several mirrors, and illuminated onto a EUV mask positioned on the mask stage 309.

Figure 3A:
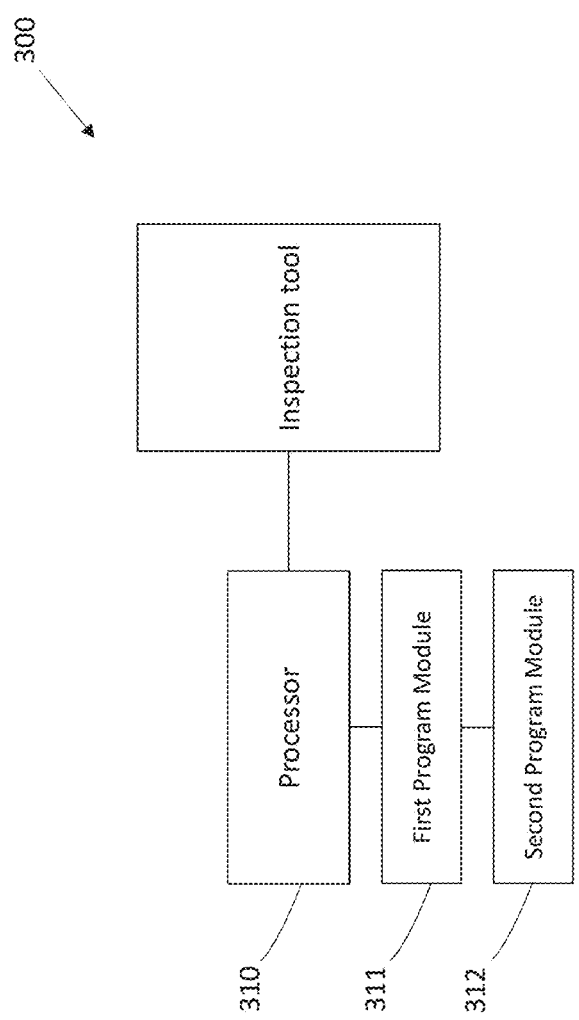
FIG. 3A shows a block diagram of a subsystem for the exemplary EUV inspection tool in FIG. 3, according to an aspect of the present disclosure.

In addition, as shown in FIG. 3A, the present EUV inspection tool 300 and its subcomponents may be coupled to a processor 310 (or other computing device) for control of the various functions. The processor 310 may be coupled to a first program module 311 configured with instructions to analyze and combine the mask pattern data 304 and mask layout information 302 to generate the out-of-plane distortion map 305$b$. In an aspect, the processor 310 may be coupled to a second program module 312 configured with instructions to analyze inspection results outputted by the inspection tool and to generate a defocus characterization map 406, as shown in FIG. 4.

Figure 4:
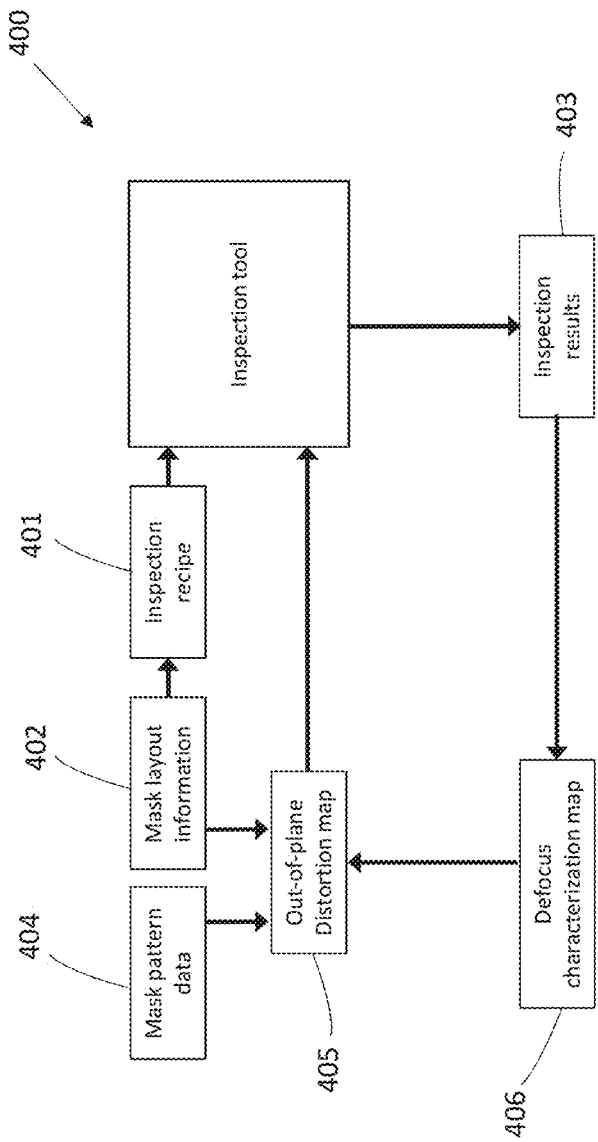
FIG. 4 shows a block diagram of an exemplary EUV inspection tool using modified out-of-plane map information according to an aspect of the present disclosure.

FIG. 4 shows a block diagram of an exemplary EUV inspection tool using a modified or replaced out-of-plane map information according to another aspect of the present disclosure. In this aspect, an out-of-plane distortion map 405 may be created from a characterization of image defocus data from an analysis of images taken from actual inspection results 403 from a pattern EUV mask of an identical or closely related design. This defocus characterization map 406 may be used as a standalone/replacement map or to modify/adjust some height parameters of the out-of-plane distortion map 405 calculated from mask pattern data 404 and mask layout information 402.

Figure 5:
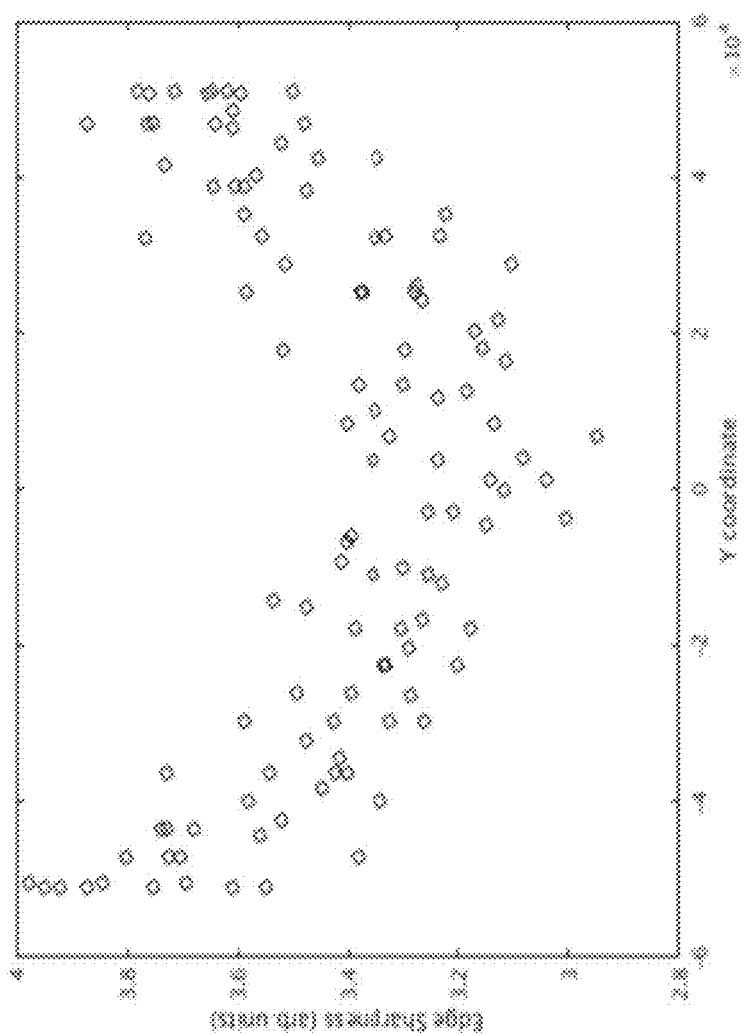
FIG. 5 shows a graphical representation of data obtain to provide focus error characterization.

FIG. 5 shows an example of a graphical representation of data obtained that may provide focus error characterization. Specifically, the characterized edge sharpness of images taken during an inspection/scan may be plotted as a function of the Y coordinates to demonstrate a bowing signature on a patterned EUV mask. A scan of approximately 100 mm in vertical Z-direction, as shown in FIG. 5, plotted as a function of the Y coordinate indicates for the tested EUV mask's central area is more blurred (i.e., defocused) than mask edge area by approximately 100 nm. Image sharpness vs. defocus value may be characterized by a companion tool, as part of a system, or by experiments performed by the present inspection tool. Conventional inspection may not properly handle the mask bowing effect caused by stress relaxation effects that depend on pattern density and layout.

Figure 6:
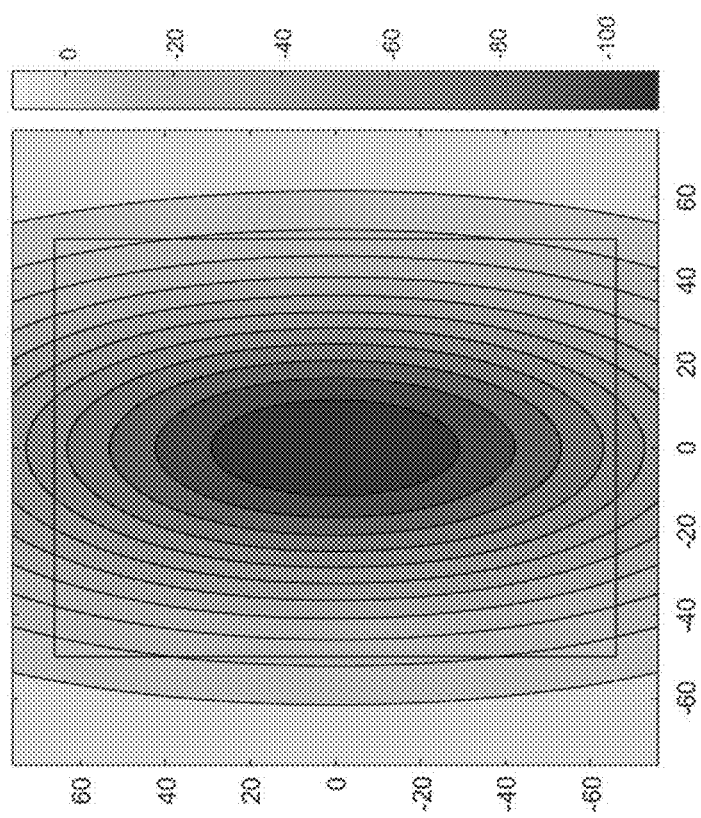
FIG. 6 shows a focus correction map according to an aspect of the present disclosure.

According to another aspect of the present disclosure, FIG. 6 shows an out-of-plane distortion/correction map that may be inputted into a present EUV inspection tool. The inputted data may be visualized as contours with a mask die area to be inspect indicated as a rectangle. The present disclosure enables improved inspections by incorporating a possible impact of the effects of bowing and other distortions by creating a two-dimensional map file (e.g., a text file) to input to a present EUV inspection tool for focus plane correction.

Figure 7:
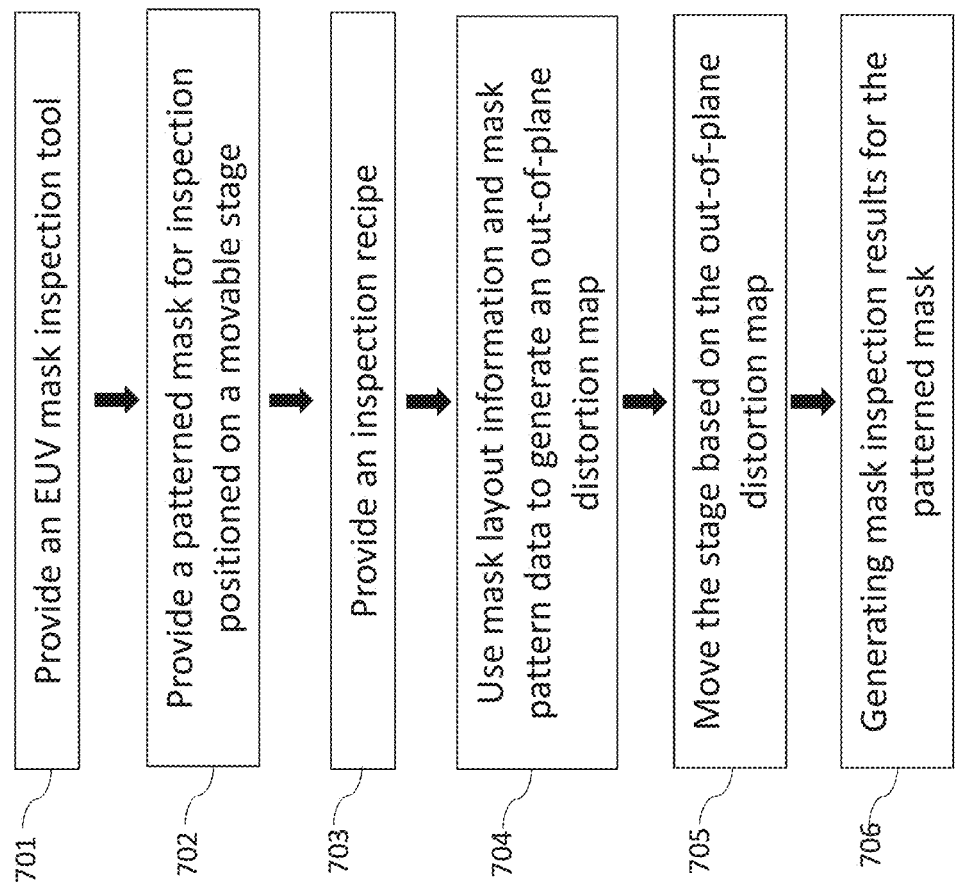
FIG. 7 shows a simplified flow diagram for an exemplary inspection method according to an aspect of the present disclosure.

FIG. 7 shows a simplified flow diagram for an exemplary inspection method according to aspects of the present disclosure. This method may be applied with the present EUV inspection tool shown in FIG. 3.

The operation 701 may be directed to providing a EUV mask inspection tool.

The operation 702 may be directed to providing a patterned mask for inspection positioned on a movable stage.

The operation 703 may be directed to providing an inspection recipe.

The operation 704 may be directed to using mask layout information and mask pattern data to generate an out-of-plane distortion map.

The operation 705 may be directed to moving the mask stage based on the out-of-plane distortion map.

The operation 706 may be directed to generating mask inspection results for the patterned mask.

Figure 8:
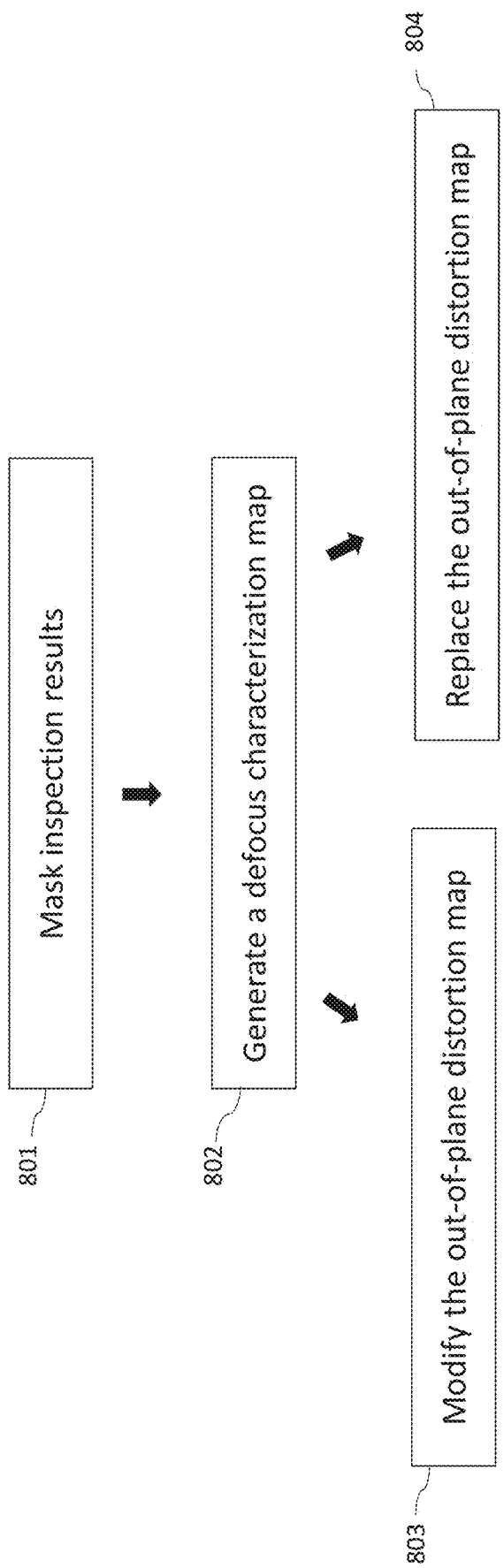
FIG. 8 shows a simplified flow diagram for an exemplary feedback method according to an aspect of the present disclosure.

FIG. 8 shows a simplified flow diagram for an exemplary inspection method according to aspects of the present disclosure. This method may be applied with the present EUV inspection tool shown in FIG. 4.

The operation 801 may be directed to obtaining EUV mask inspection results.

The operation 802 may be directed to generate a defocus characterization map from the EUV mask inspection results.

The operation 803 may be directed to modifying an existing out-of-plane distortion map with the data from the defocus characterization map before inputting to the inspection tool.

The operation 804 may be directed to replace the existing out-of-plane distortion map with the defocus characterization map before inputting to the inspection tool, as an alternative to operation 803.

The methods and sequence of steps presented above are intended to be exemplary for conducting inspection measurements according to the present disclosure. It will be apparent to those ordinary skilled practitioners that the foregoing process operations may be modified without departing from the spirit of the present disclosure.

To more readily understand and put into practical effect the present method and EUV inspection tool for, particular aspects will now be described by way of examples. For the sake of brevity, duplicate descriptions of features and properties may be omitted.

EXAMPLES

Example 1 provides a mask inspection tool including a source assembly that generates an extreme ultraviolet (EUV) light beam, a detector assembly including a projection optics system and a CCD camera, a movable stage for supporting a patterned mask at a height, and a stage control system with a processor programmed to set the height for the stage based on an out-of-plane distortion map.

Example 2 may include the mask inspection tool of example 1 and/or any other example disclosed herein, further including a first program module generating instructions to analyze and combine mask pattern data and mask layout information to generate the out-of-plane distortion map.

Example 3 may include the mask inspection tool of example 2 and/or any other example disclosed herein, in which the instructions generated by the first program module further include generating the out-of-plane distortion map using stress-induced distortion modeling.

Example 4 may include the mask inspection tool of example 3 and/or any other example disclosed herein, further including a second program module generating instructions to analyze inspection results generated by the inspection tool, in which the inspection results comprise image defocus data.

Example 5 may include the mask inspection tool of example 4 and/or any other example disclosed herein, in which the instructions generated by the second program module further include analyzing the image defocus data to generate a defocus characterization map.

Example 6 may include the mask inspection tool of example 5 and/or any other example disclosed herein, further including the second program module generating instructions to provide the first program module with the defocus characterization map as feedback to modify the out-of-plane distortion map.

Example 7 provides a method for mask inspection including providing an EUV mask inspection tool, providing a patterned mask for inspection positioned on a movable stage of the EUV mask inspection tool, providing an inspection recipe, providing mask layout information and mask pattern data to generate an out-of-plane distortion map based on stress-induced distortion modeling, moving the stage based on the out-of-plane distortion map, and generating mask inspection results for the patterned mask.

Example 8 may include the method of example 7 and/or any other example disclosed herein, further including using the mask inspection results to generate a defocus characterization map using blurring value measurements from the inspection results.

Example 9 may include the method of example 8 and/or any other example disclosed herein, in which providing the defocus characterization map further includes performing blurring value measurements by a step-by-step movement of the stage.

Example 10 may include the method of example 8 and/or any other example disclosed herein, further including providing the defocus characterization map as input to the inspection tool to adjust selected height parameters of the out-of-plane distortion map.

Example 11 may include the method of example 8 and/or any other example disclosed herein, further including providing the defocus characterization map as a replacement for the out-of-plane distortion map.

Example 12 may include the method of example 8 and/or any other example disclosed herein, further including generating a further set of inspection results and providing a further defocus characterization map as input to the inspection tool to further adjust selected height parameters of the out-of-plane distortion map.

Example 13 may provide a method for mask inspection including providing predictive data and actual measured data for stage heights for use by a mask inspection tool for an inspection of a patterned EUV mask to obtain inspection results that compensate for defocusing due to bowing of the patterned EUV mask.

Example 14 may include the method of example 13 and/or any other example disclosed herein, further including the predictive data being provided to the mask inspection tool as an out-of-plane distortion map.

Example 15 may include the method of example 14 and/or any other example disclosed herein, in which providing an out-of-plane distortion map further includes analyzing and combining mask pattern data and mask layout information to generate.

Example 16 may include the method of example 13 and/or any other example disclosed herein, further including the actual measured data being provided as a defocus characterization map generated from inspection results from the patterned EUV mask.

Example 17 may include the method of example 14 and/or any other example disclosed herein, in which the out-of-plane distortion map is generated by stressed induced distortion modeling that uses density properties of a patterned absorber layer of the patterned mask.

Example 18 may include the method of example 16 and/or any other example disclosed herein, in which the defocus characterization map is generated from the measured data using blurring value measurements of the patterned mask.

Example 19 may include the method of example 16 and/or any other example disclosed herein, further including providing the defocus characterization map as a replacement for the out-of-plane distortion map.

Example 20 may include the method of example 16 and/or any other example disclosed herein, further including providing the defocus characterization map as input to the inspection tool to adjust selected height parameters of the out-of-plane distortion map.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A mask inspection tool comprising:
    a source assembly configured to generate an extreme ultraviolet (EUV) light beam;
    a detector assembly comprising a projection optics system and a CCD camera;
    a movable stage supporting a patterned mask at a height; and
    a stage control system with a processor programmed to set the height for the stage based on an out-of-plane distortion map.

2. The mask inspection tool of claim 1, further comprising:
    a first program module generating instructions to analyze and combine mask pattern data and mask layout information to generate the out-of-plane distortion map.

3. The mask inspection tool of claim 2, wherein the instructions generated by the first program module further comprise generating the out-of-plane distortion map using stress-induced distortion modeling.

4. The mask inspection tool of claim 3, further comprising:
    a second program module generating instructions to analyze inspection results generated by the inspection tool, wherein the inspection results comprise image defocus data.

5. The mask inspection tool of claim 4, wherein the instructions generated by the second program module further comprise analyzing the image defocus data to generate a defocus characterization map.

6. The mask inspection tool of claim 5, further comprising:
    the second program module generating instructions to provide the first program module with the defocus characterization map as feedback to modify the out-of-plane distortion map.

7. A method for mask inspection comprising:
    providing a EUV mask inspection tool;
    providing a patterned mask for inspection positioned on a movable stage of the EUV mask inspection tool;
    providing an inspection recipe;
    providing mask layout information and mask pattern data to generate an out-of-plane distortion map based on stress-induced distortion modeling;
    moving the stage based on the out-of-plane distortion map; and
    generating mask inspection results for the patterned mask.

8. The method of claim 7, further comprising using the mask inspection results to generate a defocus characterization map using blurring value measurements from the inspection results.

9. The method of claim 8, wherein providing the defocus characterization map further comprises performing blurring value measurements by a step by step movement of the stage.

10. The method of claim 8, further comprising providing the defocus characterization map as input to the inspection tool to adjust selected height parameters of the out-of-plane distortion map.

11. The method of claim 8, further comprising providing the defocus characterization map as a replacement for the out-of-plane distortion map.

12. The method of claim 8, further comprising generating a further set of inspection results and providing a further defocus characterization map as input to the inspection tool to further adjust selected height parameters of the out-of-plane distortion map.

13. A method for mask inspection comprising:

providing predictive data and actual measured data for stage heights for use by a mask inspection tool for an inspection of a patterned EUV mask to obtain inspection results that compensate for defocusing due to bowing of the patterned EUV mask.

14. The method of claim 13, further comprising the predictive data being provided to the mask inspection tool as an out-of-plane distortion map.

15. The method of claim 14, wherein the out-of-plane distortion map further comprises analyzing and combining mask pattern data and mask layout information to generate.

16. The method of claim 13, further comprising the actual measured data being provided as a defocus characterization map generated from inspection results from the patterned EUV mask.

17. The method of claim 14, wherein the out-of-plane distortion map is generated by stress induced distortion modeling using density properties of a patterned absorber layer of the patterned mask.

18. The method of claim 16, wherein the defocus characterization map is generated from the measured data using blurring value measurements of the patterned mask.

19. The method of claim 16, further comprising providing the defocus characterization map as a replacement for the out-of-plane distortion map.

20. The method of claim 16, further comprising providing the defocus characterization map as input to the inspection tool to adjust selected height parameters of the out-of-plane distortion map.

* * * * *